United States Patent
Darmawikarta et al.

(10) Patent No.: US 10,361,121 B2
(45) Date of Patent: Jul. 23, 2019

(54) ALUMINUM OXIDE FOR THERMAL MANAGEMENT OR ADHESION

(71) Applicant: Intel Corporation, Santa Clara, CA (US)

(72) Inventors: Kristof Darmawikarta, Chandler, AZ (US); Sri Ranga Sai Boyapati, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 289 days.

(21) Appl. No.: 15/154,493

(22) Filed: May 13, 2016

(65) Prior Publication Data
US 2017/0330795 A1    Nov. 16, 2017

(51) Int. Cl.
*H01L 21/76*    (2006.01)
*H01L 21/768*   (2006.01)
(Continued)

(52) U.S. Cl.
CPC .. *H01L 21/76867* (2013.01); *H01L 21/31116* (2013.01); *H01L 21/32055* (2013.01);
(Continued)

(58) Field of Classification Search
CPC .... H01L 21/31; H01L 21/311; H01L 21/3111; H01L 21/31116; H01L 21/32; H01L 21/321; H01L 21/3213; H01L 21/32134; H01L 21/32136; H01L 21/48; H01L 21/486; H01L 21/76; H01L 21/768; H01L 21/768; H01L 21/76804; H01L 21/7685;
(Continued)

(56) References Cited

U.S. PATENT DOCUMENTS

| 4,314,874 A * | 2/1982 | Abe .................... C23F 4/00 204/192.25 |
| 2007/0032061 A1* | 2/2007 | Farnworth ........ H01L 21/76898 438/597 |

(Continued)

FOREIGN PATENT DOCUMENTS

| JP | 2004111536 A | 4/2004 |
| JP | 2010161322 A | 7/2010 |
| JP | 2011119502 A | 6/2011 |

OTHER PUBLICATIONS

International Search Report and Written Opinion dated Sep. 25, 2017 for International Application No. PCT/US2017/027438, 13 pages.

*Primary Examiner* — Monica D Harrison
(74) *Attorney, Agent, or Firm* — Schwabe, Williamson & Wyatt, P.C.

(57) ABSTRACT

Embodiments herein relate to a package using aluminum oxide as an adhesion and high-thermal conductivity layer with a buildup layer having a first side and a second side opposite the first side, a first trace applied to the first side of the buildup layer, an aluminum oxide layer coupled with the first trace and an exposed area of the first side of the buildup layer, a lamination buildup layer coupled with the aluminum oxide layer on a side of the aluminum oxide layer opposite the buildup layer, wherein the lamination buildup layer includes one or more vias to the trace, and a seed layer coupled with the lamination buildup layer. Other embodiments may be described and/or claimed.

7 Claims, 7 Drawing Sheets

(51) Int. Cl.
*H01L 21/311* (2006.01)
*H01L 21/3205* (2006.01)
*H01L 21/3213* (2006.01)
*H01L 23/373* (2006.01)
*H01L 23/498* (2006.01)
*H01L 21/48* (2006.01)

(52) U.S. Cl.
CPC .. *H01L 21/32134* (2013.01); *H01L 21/32136* (2013.01); *H01L 21/486* (2013.01); *H01L 21/4857* (2013.01); *H01L 21/76804* (2013.01); *H01L 21/76852* (2013.01); *H01L 23/3731* (2013.01); *H01L 23/3738* (2013.01); *H01L 23/49894* (2013.01)

(58) Field of Classification Search
CPC ........... H01L 21/76852; H01L 21/7686; H01L 21/76867; H01L 23/37; H01L 23/373; H01L 23/3731; H01L 23/3738

USPC ...................................................... 257/751
See application file for complete search history.

(56) References Cited

U.S. PATENT DOCUMENTS

| | | | |
|---|---|---|---|
| 2007/0063241 A1* | 3/2007 | Sashida | H01L 21/7682 257/296 |
| 2011/0211320 A1* | 9/2011 | Maeda | H01L 21/6835 361/782 |
| 2012/0329267 A1* | 12/2012 | Horak | H01L 21/76885 438/627 |
| 2015/0249038 A1* | 9/2015 | Xu | H01L 23/53223 257/751 |
| 2015/0318402 A1 | 11/2015 | Yamazaki et al. | |
| 2016/0056102 A1 | 2/2016 | Konchady et al. | |

* cited by examiner

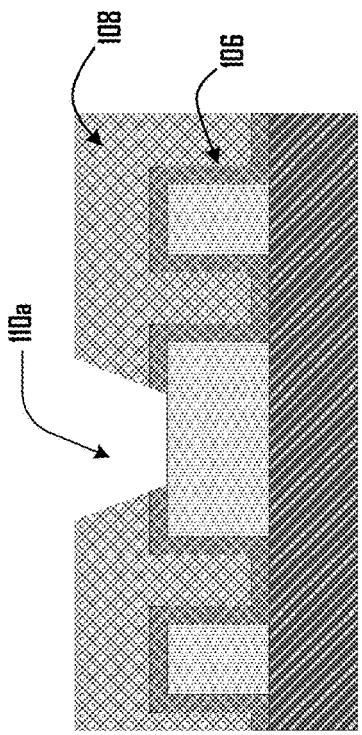
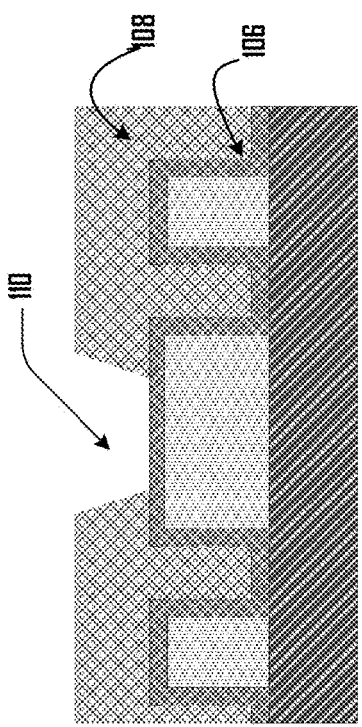
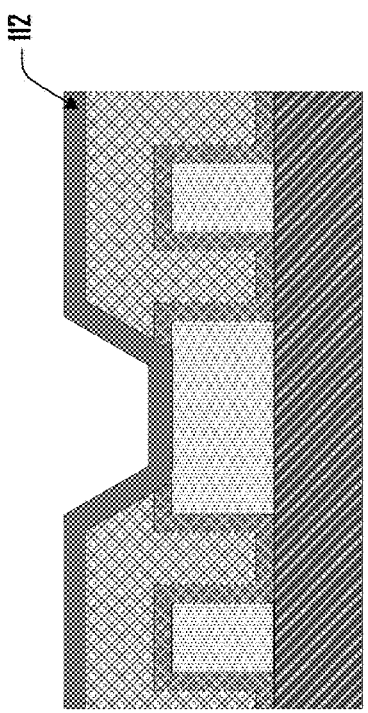

ALUMINUM OXIDE FOR THERMAL MANAGEMENT OR ADHESION

FIELD

Embodiments of the present disclosure generally relate to the field of package assemblies, and in particular package assemblies having high thermal conductivity.

BACKGROUND

Continued reduction in end product size of mobile electronic devices such as smart phones and ultrabooks is a driving force for the development of packaging with a small form factor having improved thermal management capabilities. In legacy substrate architectures, thermal management is handled both internal and external to the substrate structure. Solutions external to the substrate structure typically use an integrated heat sink that may be attached via a thermal paste to the logic die.

Solutions internal to the substrate structure typically involve increasing the overall thermal conductivity by, for example, using a special high thermal conductivity build up material, forming dedicated copper thermal vias, and/or reducing the core thickness. Examples may also include increasing the heat capacity using thicker copper traces and/or embedding copper blocks/chips. However, these legacy implementations have challenges of sacrificing design rule flexibility. For example, additional real estate on the substrate must be reserved to accommodate embedded copper chip and copper thermal vias; increasing copper trace thickness will limit line space scaling; and relying on an outsourced, proprietary build up material with high thermal conductivity may be costly.

BRIEF DESCRIPTION OF THE DRAWINGS

FIGS. 1A through 1L illustrate an example of a package assembly at various stages of a manufacturing process, in accordance with embodiments.

DETAILED DESCRIPTION

Figure 1B:
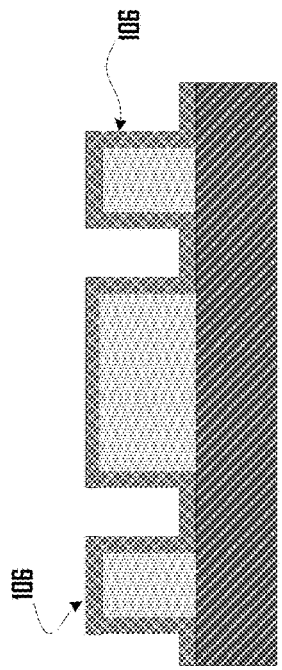

Embodiments of the present disclosure generally relate to the use of Plasma Enhanced Chemical Vapor Deposition (PECVD) aluminum oxide, for example $Al_2O_3$, thin film layers, which may act as a thin film adhesion layer between copper and epoxy, and also as a thermal management layer.

In embodiments, due to the non-etching behavior of the PECVD process, aluminum oxide thin film adhesion layer may enable a greater line space scaling than legacy processes. Legacy processes may rely on copper etching to create high surface area for mechanical adhesion between copper traces and incoming epoxy dielectric. In legacy processes, to compensate for this etching process, the traces need to be electrolytically plated thicker and wider. In legacy processes, the photoresist that defines the copper traces and spaces needs to be capable of high-aspect ratio resolution. In legacy processes, as line (trace) space is scaled-down, the photoresist aspect ratio increases and will eventually meet its limit. With a non-etching process as disclosed herein, compensation for copper losses due to etching may not be needed. Therefore, copper line space may be scaled above those achievable by legacy processes.

The number of electrical connections per unit length may be defined by the number of conducting traces and how far the traces are spaced from each other. The smaller the width of trace and space between them, more connections per unit length may be achieved. It is therefore desirable to scale the lines and spaces to achieve higher interconnect density. To achieve comparable thermal conductivity of existing high thermal conductivity build up materials, for example in the 3-5 of watts per meter Kelvin (W/mK), aluminum oxide thickness may be between 30 and 50 nanometers (nm). In embodiments, this thickness may be negligible relative to the total substrate thickness. For at least this reason, PECVD aluminum oxide may have a minimal impact on substrate design rules. In addition, the PECVD process may allow materials engineers to improve other characteristics of the buildup laminate, for example dielectric loss tangent, coefficient of thermal expansion (CTE), and the like.

In some cases, the aluminum oxide layer may be a thin film adhesion layer. In embodiments, this may result from the aluminum oxide forming chemical bonds with the copper on one side and with the epoxy on the other side. In addition, a non-etching adhesion layer may result in a smooth copper trace surface, which may provide the increased electrical performance due to lower power loss. In other embodiments, the aluminum oxide layer may be a thermal management layer. In embodiments, aluminum oxide has a high thermal conductivity which, in turn, they allow a substrate to dissipate heat faster through the aluminum oxide layer. In embodiments, layers of aluminum oxide around 50 nm thick may not pose design rule restrictions, unlike legacy processes that include thermal vias and copper blocks.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIGS. 1A through 1L depict an example of such a package assembly at various stages of the manufacturing process. In embodiments, one or more elements may be introduced in an earlier figure, for example FIG. 1A, and then assumed to carry over to later Figures such as FIG. 1B. Therefore, each and every element of the package assembly 100 may not be labeled in each and every stage of FIGS. 1A through 1L for the sake of clarity and the ease of understanding.

Figure 1A:
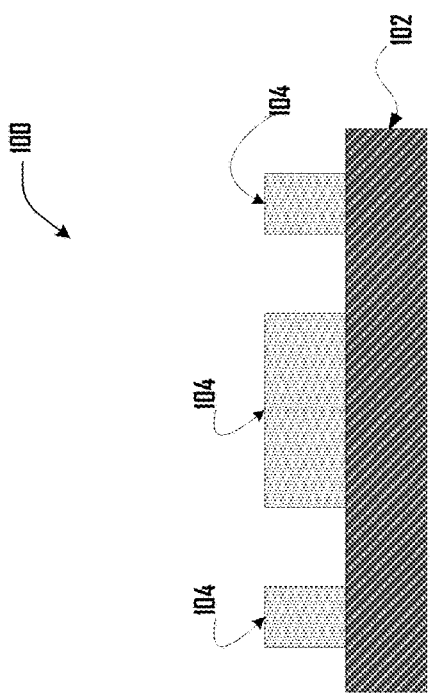

Specifically, FIG. 1A shows a package assembly embodiment 100 that includes various stages of a process flow incorporating plasma enhanced chemical vapor deposition (PECVD) with aluminum oxide. In embodiments, PECVD may refer to a process used to deposit thin films from a gas state (vapor) to a solid state on a substrate. Chemical reactions may be involved in the process, which occur after the reacting gasses are in a plasma. The plasma is generally created by microwave, radio frequency or alternating current (AC) frequency or direct current (DC) discharge between two electrodes, the space between which is filled with the reacting gases. In embodiments, a dielectric layer 102, which may be a buildup layer, may have pads and traces 104 coupled to it. Although described as traces, in some embodiments element 104 may additionally or alternatively be a pad or some other conductive element. In embodiments, the traces may be copper (Cu). In other embodiments, the traces may be any other suitable metal.

Next, as shown in FIG. 1B, in embodiments a PECVD aluminum oxide layer 106 may be deposited on the dielectric layer 102 and the traces 104. In embodiments, the aluminum oxide layer 106 may be between 30 and 50 nanometers (nm) thick. In embodiments, an additional layer of silicon nitride (SiNx) (not shown), which may be a thin film layer, may be deposited on the aluminum oxide layer 106. In embodiments, this may serve as a barrier layer to prevent or to mitigate copper migration. In embodiments, it may serve as an adhesion layer, electromigration barrier, or passivation layer.

In embodiments, PECVD may be a desirable deposition technique due to its high conformity. In a non-limiting example, PECVD may provide better coverage around the traces and features compared to legacy deposition techniques such as sputtering. In addition, although atomic layer deposition may provide her conformity compared to PECVD, atomic layer deposition cost is typically much higher.

Figure 1C:
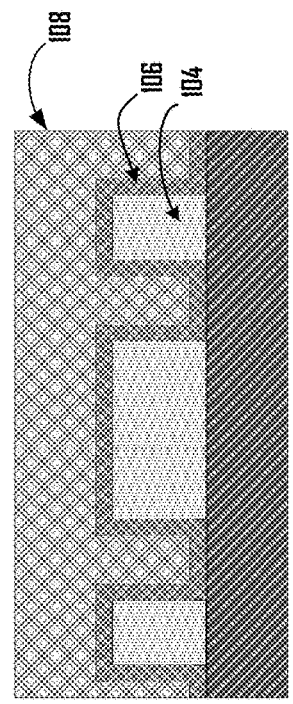

Next, as shown in FIG. 1C, in embodiments a lamination layer 108 may be added. In embodiments, lamination layer 108 may be a buildup layer. In embodiments, the lamination layer 108 may be coupled to the aluminum oxide layer 106. In embodiments, the lamination layer 108 may be an epoxy dielectric that may come in rolls to be inserted into a laminator tool that physically laminates epoxy onto a substrate. The laminate may then be subsequently hot-pressed and then thermally cured. In other embodiments, the lamination layer 108 may be coupled to a silicon nitride layer (not shown), and may be subsequently cured.

Next, as shown in FIG. 1D, in embodiments a portion 110 of the lamination layer 108 may be removed. In embodiments, this removal may be performed using a laser via drill (not shown), or plasma etching with a hard mask. In embodiments, an epoxy dielectric with photo-sensitive additives may be used. UV exposure through a mask may then initiate cross linking of the epoxy. The portion that is un-exposed may be developed (dissolved) in a developer solution and form portion 110. In embodiments, the portion 110 may expose the aluminum oxide layer 106.

Next, as shown in FIG. 1E, in embodiments a smearing and/or aluminum oxide etching may be performed resulting in via 110a, where traces 104 may be exposed. As discussed above, laser drilling may have also exposed or partially exposed traces 104. In embodiments, etching of the aluminum oxide layer may be performed using a phosphoric acid or potassium hydroxide (KOH). In embodiments, with respect to smearing, legacy CO2 laser processes may leave residue at the via bottom. This residue, which may also be referred to as smear, may be cleaned through a process referred to as DESMEAR. In embodiments, this process may be performed with a permanganate-based solution.

In embodiments, if legacy laser technology, for example CO2 laser, is used, the smear may need to be cleaned before the aluminum oxide is etched. Aluminum oxide etching may be done with phosphoric acid or with a hydroxide-based solution. If an ultraviolet (UV) laser is used, the aluminum oxide may be ablated, which may also remove residue. This may reduce the total number of process events to create the via 110a.

In other embodiments, the aluminum oxide layer may be ablated during the laser drilling process as described for FIG. 1E. In embodiments, depending on the laser wavelength used, a material may be able to absorb the laser energy, and this energy may be used to break the bonds between molecules and/or atoms. This may provide a more direct way to remove material and to potentially avoid further cleaning processes, for example post laser etching, with wet or dry process.

Next, as shown in FIG. 1F, in embodiments a conductive seed layer 112 may be deposited. In embodiments, an electroless copper deposition or a sputter deposition may be used. In embodiments, the conductive seed layer 112 may be a titanium/copper sputter. In embodiments, titanium may be replaced with chromium or tantalum. In embodiments, copper may be up replaced with ruthenium, or with a copper alloy.

Figure 1G:
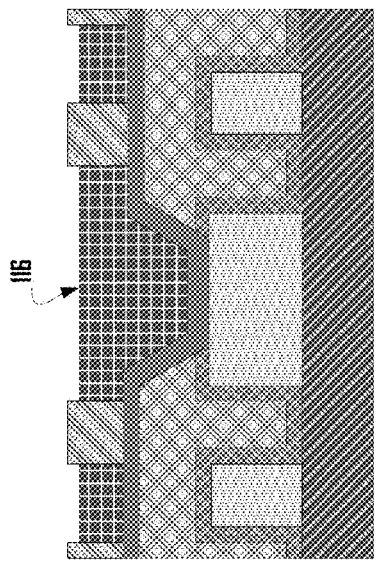

Next, as shown in FIG. 1G, a resist 114 may be deposited, exposed, and developed. In embodiments, a resist may be a photoresist: a photodefinable polymer that may be used to make patterns. In embodiments, a resist may be a dry film type that is laminated using a laminator. In embodiments, UV exposure may be used through a mask that may contain an inverse of a pattern that may initiate cross linking. In embodiments, the unexposed portion may be developed (dissolved) in a developer solution, thus transferring the pattern from the mask. The photoresist opening may then be electrolytically copper plated to form metal traces and pads.

Figure 1H:
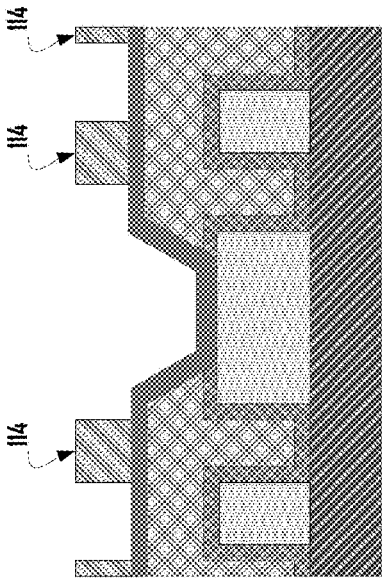

Next, as shown in FIG. 1H, electrolytic copper plating 116 may be applied. In embodiments, the copper may be electrolytically plated. In embodiments, the copper may be nominally pure copper. In other embodiments, organic additives from the copper plating solution may be embedded in the plated copper.

Figure 1I:
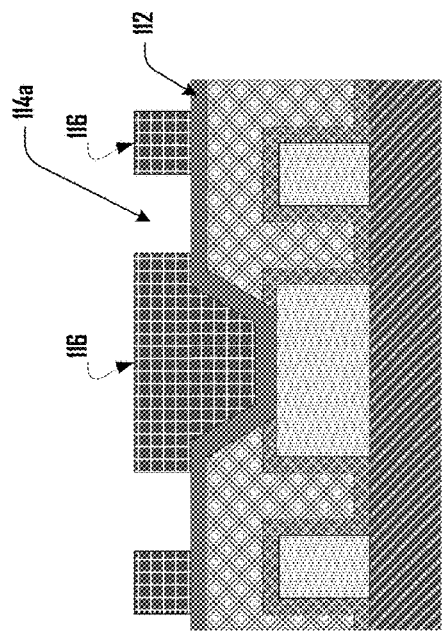

Next, as shown in FIG. 1I, resist 114 may be stripped away leaving spaces 114a that provide access to the conductive seed layer 112. In embodiments, a photo resist strip solution, in one non-limiting example tetramethylammonium hydroxide (TMAH), may be used to strip the resist.

Figure 1K:
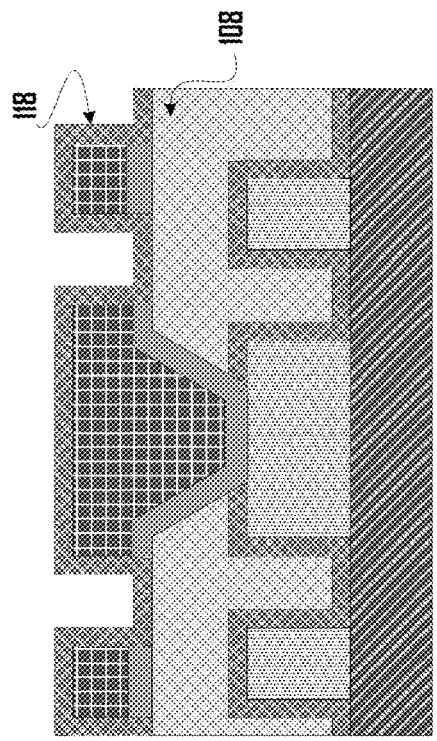
Figure 1J:
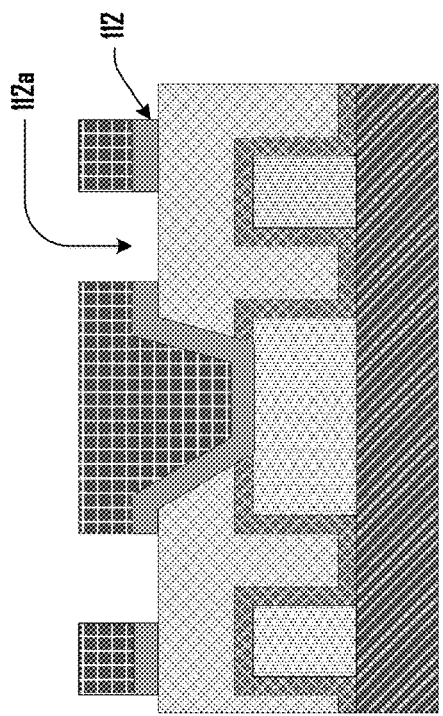

Next, as shown in FIG. 1J, areas of the conductive seed layer 112 may be etched away 112a. In embodiments, this etching may be done with peroxide and/or sulphuric acid solution.

Next, as shown in FIG. 1K, another aluminum oxide layer 118 may be applied on the lamination layer 108 and/or the electrolytic copper plating 116. The process by which the aluminum oxide layer 118 is applied may be similar to the PECVD process described above with respect to deposition of aluminum oxide layer 106.

Figure 1L:
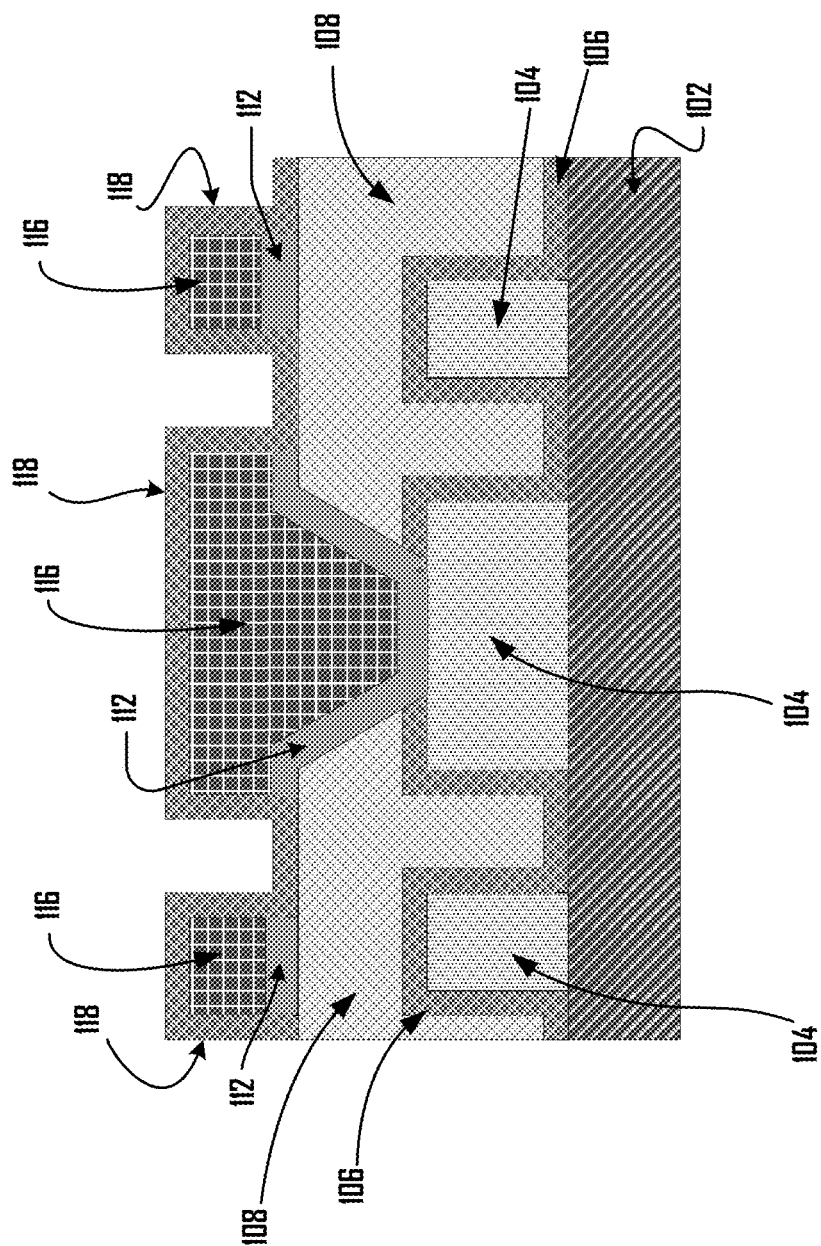

FIG. 1L shows one embodiment of a package assembly that includes a dielectric layer 102, traces 104, an aluminum oxide layer 106, a lamination layer 108, a conductive seed layer 112, electrolytic copper plating 116, and an aluminum oxide layer 118.

Figure 2:
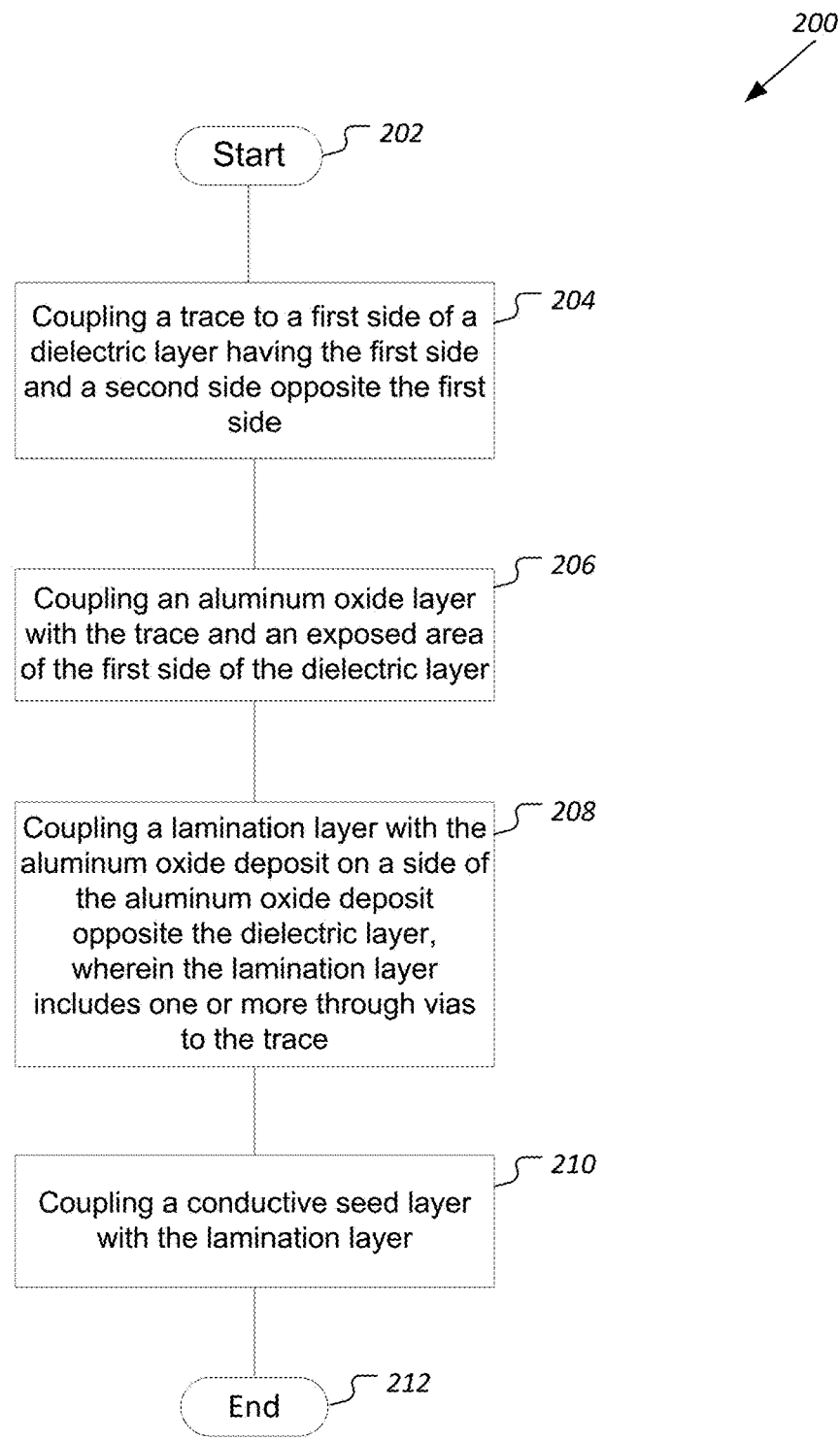
FIG. 2 illustrates an example of a process for manufacturing a package assembly, in accordance with embodiments.

FIG. 2 depicts an example flow diagram showing a process 200 for manufacturing a package assembly such as package assembly 100, according to various embodiments. The process 200 may start at block 202.

At block 204, a first trace may be coupled to a first side of the buildup layer having the first side and a second side opposite the first side. In embodiments, the first trace may be similar to trace 104. The buildup layer may be similar to dielectric layer 102. As noted above, the trace may be coupled with the buildup layer at block 204, where the buildup layer may be a dielectric layer 102 with traces 104 coupled to it.

At block 206, an aluminum oxide layer may be coupled with the first trace and an exposed area of the first side of the buildup layer. In embodiments, the first trace may be similar to the trace 104. The oxide layer may be similar to the aluminum oxide layer 106. The buildup layer may be similar to the dielectric layer 102. As noted above, the aluminum oxide layer may be coupled at block 206 using a PECVD process to couple the aluminum oxide layer 106 to the traces 104.

At block 208, a lamination buildup layer may be coupled with the aluminum oxide deposit layer on a side of the aluminum oxide deposit opposite the buildup layer, wherein the lamination buildup layer includes one or more vias to the trace. In embodiments, the aluminum oxide deposit may be similar to the aluminum oxide layer 106. The lamination buildup layer may be similar to the lamination layer 108. As noted above, the lamination buildup layer may be coupled with the aluminum oxide layer at block 208 and may be an epoxy dielectric that may be inserted with a laminator tool (not shown).

At block 210, a seed layer may be coupled with the lamination buildup layer. In embodiments, the seed layer may be similar to the conductive seed layer 112. The buildup layer may be similar to lamination layer 108. As noted above, the seed layer may be coupled with the lamination layer at block 210 by an electroless copper deposition or using a copper sputter deposition.

At block 212, the process may end.

Figure 3:
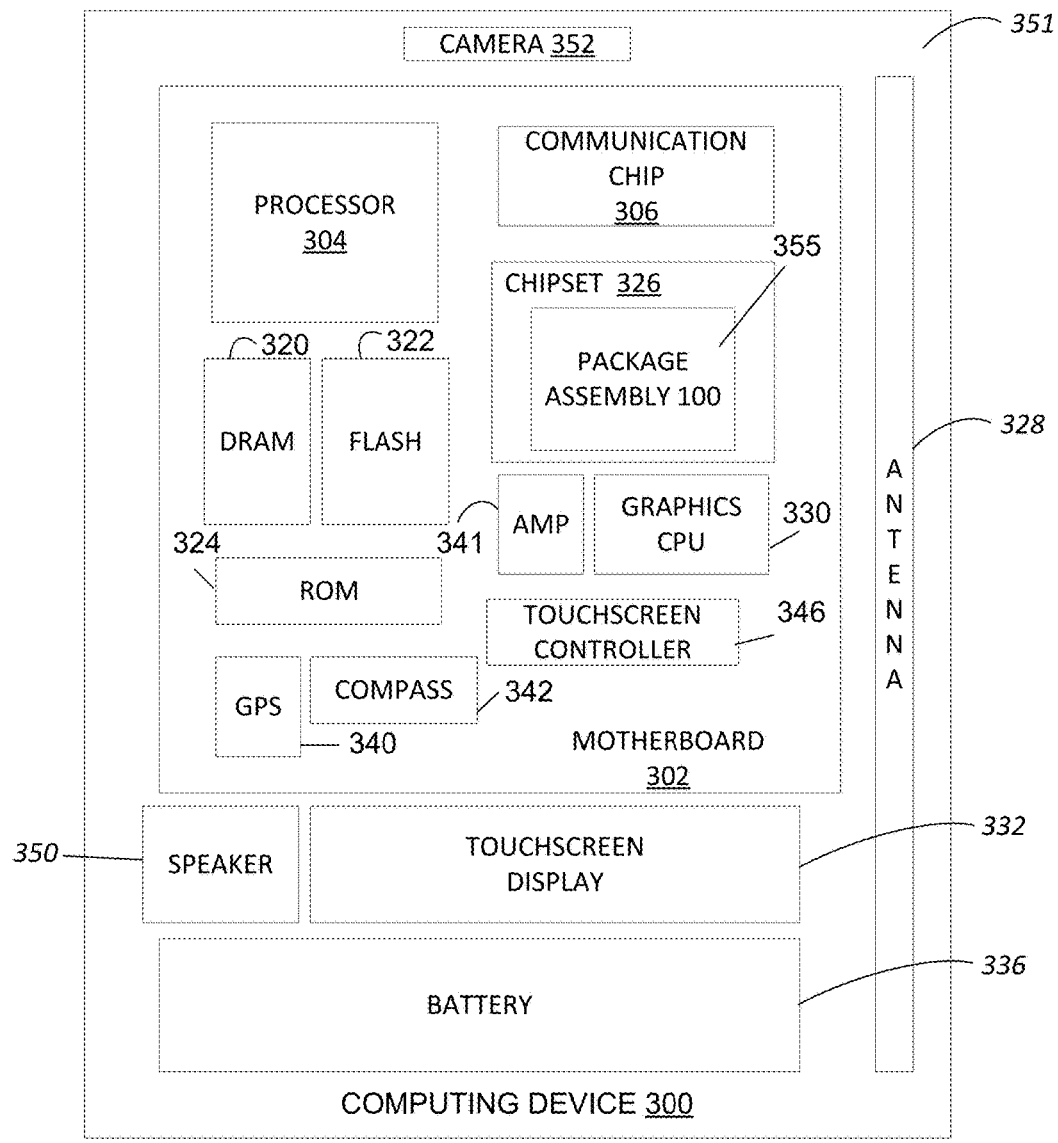
FIG. 3 schematically illustrates a computing device, in accordance with embodiments.

Embodiments of the present disclosure may be implemented into a system using any suitable hardware and/or software to configure as desired. FIG. 3 schematically illustrates a computing device 300 in accordance with one embodiment. The computing device 300 may house a board such as motherboard 302 (i.e. housing 351). The motherboard 302 may include a number of components, including but not limited to a processor 304 and at least one communication chip 306. The processor 304 may be physically and electrically coupled to the motherboard 302. In some implementations, the at least one communication chip 306 may also be physically and electrically coupled to the motherboard 302. In further implementations, the communication chip 306 may be part of the processor 304.

Depending on its applications, computing device 300 may include other components that may or may not be physically and electrically coupled to the motherboard 302. These other components may include, but are not limited to, volatile memory (e.g., DRAM) 320, non-volatile memory (e.g., ROM) 324, flash memory 322, a graphics processor 330, a digital signal processor (not shown), a crypto processor (not shown), a chipset 326, an antenna 328, a display (not shown), a touchscreen display 332, a touchscreen controller 346, a battery 336, an audio codec (not shown), a video codec (not shown), a power amplifier 341, a global positioning system (GPS) device 340, a compass 342, an accelerometer (not shown), a gyroscope (not shown), a speaker 350, a camera 352, and a mass storage device (such as hard disk drive, compact disk (CD), digital versatile disk (DVD), and so forth) (not shown). Further components, not shown in FIG. 3, may include a microphone, a filter, an oscillator, a pressure sensor, or an RFID chip. In embodiments, one or more of the package assembly components 355 may be a package assembly such as package assembly 100 shown in FIG. 1K.

The communication chip 306 may enable wireless communications for the transfer of data to and from the computing device 300. The term "wireless" and its derivatives may be used to describe circuits, devices, systems, processes, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 306 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 306 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 306 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 306 may operate in accordance with other wireless protocols in other embodiments.

The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 may include a die in a package assembly such as, for example, one of package assemblies 100 described herein. The term "processor" may refer to any device or portion of a device that processes electronic data from registers and/or memory to transform that electronic data into other electronic data that may be stored in registers and/or memory.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data, for example an all-in-one device such as an all-in-one fax or printing device.

EXAMPLES

Example 1 may be a package comprising: a dielectric layer having a first side and a second side opposite the first side; a first trace applied to the first side of the dielectric layer; an aluminum oxide layer coupled with the first trace and an exposed area of the first side of the buildup layer; a lamination layer coupled with the aluminum oxide layer on a side of the aluminum oxide layer opposite the dielectric layer, wherein the lamination layer includes one or more vias to the trace; and a conductive seed layer coupled with the lamination layer.

Example 2 may include the package of example 1, or of any other example herein, wherein the aluminum oxide layer is a first aluminum oxide layer, and further comprising: a second trace applied to the conductive seed layer, wherein subsequent to the second trace being applied, an exposed area of the conductive seed layer is removed to expose a portion of the lamination layer; and a second aluminum oxide layer coupled with the conductive seed layer and the second trace.

Example 3 may include the package of examples 1 or 2, or of any other example herein, wherein the first or the second aluminum oxide layer is deposited using a Plasma Enhanced Chemical Vapor Deposition, PECVD.

Example 4 may include the package of any of examples 1 or 2, or of any other example herein, wherein the thickness of the aluminum oxide layer as measured in a direction perpendicular to the first side of the dielectric layer is between approximately 30 and approximately 50 nm, nanometers.

Example 5 may include the package of examples 1 or 2, or of any other example herein, wherein the first or the second trace is a copper trace.

Example 6 may include the package of examples 1 or 2, or of any other example herein, wherein the one or more vias are created by a laser via drill and an etching solution.

Example 7 may include the package of examples 1 or 2, or of any other example herein, wherein the aluminum oxide layer is etched via phosphoric acid or potassium hydroxide solution.

Example 8 may include the package of example 1, or of any other example herein, further comprising a silicon nitride, SiNx, thin film layer coupled with the second aluminum oxide layer, wherein the SiNx layer is an adhesion layer, electromigration barrier, or passivation layer.

Example 9 may be a method for creating a package, comprising: coupling a first trace to a first side of a dielectric layer having the first side and a second side opposite the first side; coupling an aluminum oxide layer with the first trace and an exposed area of the first side of the dielectric layer; coupling a lamination layer with the aluminum oxide layer on a side of the aluminum oxide layer opposite the dielectric layer, wherein the lamination layer includes one or more vias to the trace; and coupling a conductive seed layer with the first trace.

Example 10 may include the method of example 9, or of any other example herein, further comprising: applying a second trace to the conductive seed layer, wherein subsequent to the second trace being applied an exposed area of the conductive seed layer is removed to expose a portion of the lamination layer; and coupling a second aluminum oxide layer with the second trace.

Example 11 may include the method of examples 9 or 10, or of any other example herein, wherein the first or the second aluminum oxide layer is deposited using a Plasma Enhanced Chemical Vapor Deposition, PECVD.

Example 12 may include the method of examples 9 or 10, or of any other example herein, wherein the thickness of the aluminum oxide layer as measured in a direction perpendicular to the first side of the dielectric layer is between approximately 30 and approximately 50 nm, nanometers.

Example 13 may include the method of examples 9 or 10, or of any other example herein, wherein the first or the second trace is a copper trace.

Example 14 may include the method of examples 9 or 10, or of any other example herein, further comprising creating the one or more vias by a laser via drill and an etching solution.

Example 15 may include the method of examples 9 or 10, or of any other example herein, further comprising etching the aluminum oxide layer by phosphoric acid or potassium hydroxide solution.

Example 16 may include the method of example 9, or of any other example herein, further comprising coupling a silicon nitride, SiNx, thin film layer to the second aluminum oxide layer, wherein the SiNx layer is an adhesion layer, electromigration barrier, or passivation layer.

Example 17 may be a system with a package assembly, the system comprising: a circuit board; a package assembly coupled with the circuit board, the package assembly comprising: a dielectric layer having a first side and a second side opposite the first side; a first trace applied to the first side of the dielectric layer; an aluminum oxide layer coupled with the first trace and an exposed area of the first side of the dielectric layer; a lamination layer coupled with the aluminum oxide layer on a side of the aluminum oxide layer opposite the dielectric layer, wherein the lamination buildup layer includes one or more vias to the trace; and a conductive seed layer coupled with the lamination layer.

Example 18 may include the system of example 17, or of any other example herein, wherein the aluminum oxide layer is a first aluminum oxide layer; and the package assembly further comprising: a second trace applied to the conductive seed layer, wherein subsequent to the second trace being applied an exposed area of the conductive seed layer is removed to expose a portion of the lamination layer; and a second aluminum oxide layer coupled with second trace.

Example 19 may include the system of examples 17 or 18, or of any other example herein, wherein the first or the second aluminum oxide layer is deposited using a Plasma Enhanced Chemical Vapor Deposition, PECVD.

Example 20 may include the system of examples 17 or 18, or of any other example herein, wherein the thickness of the aluminum oxide layer as measured in a direction perpendicular to the first side of the dielectric layer is between approximately 30 and approximately 50 nm, nanometers.

Example 21 may include the system of examples 17 or 18, or of any other example herein, wherein the first or the second trace is a copper trace.

Example 22 may include the system of examples 17 or 18, or of any other example herein, wherein the one or more vias are created by a laser via drill and an etching solution.

Example 23 may include the system of examples 17 or 18, or of any other example herein, wherein the aluminum oxide layer is etched with phosphoric acid or potassium hydroxide solution.

Example 24 may include the system of examples 11 through 17, or of any other example herein, wherein the package assembly further comprises a silicon nitride, SiNx, thin film layer coupled with the second aluminum oxide layer, wherein the SiNx layer is an adhesion layer, electromigration barrier, or passivation layer.

Example 25 may be a device comprising: means for coupling a first trace to a first side of a dielectric layer having the first side and a second side opposite the first side; means for coupling an aluminum oxide layer with the first trace and an exposed area of the first side of the dielectric layer; means for coupling a lamination layer with the aluminum oxide layer on a side of the aluminum oxide layer opposite the dielectric layer, wherein the lamination layer includes one or more vias to the trace; and means for coupling a conductive seed layer with the lamination layer.

Example 26 may include the device of example 25, or of any other example herein, further comprising: means for applying a second trace to the conductive seed layer, wherein the aluminum oxide layer is a first aluminum oxide layer, and subsequent to the second trace being applied an exposed area of the conductive seed layer is removed to expose a portion of the lamination layer; and means for coupling a second aluminum oxide layer with the seed layer and the exposed portion of the lamination layer.

Example 27 may include the device of examples 25 or 26, or of any other example herein, wherein the first or the second aluminum oxide layer is deposited using a Plasma Enhanced Chemical Vapor Deposition, PECVD.

Example 28 may include the device of examples 25 or 26, or of any other example herein, wherein the thickness of the aluminum oxide layer as measured in a direction perpendicular to the first side of the dielectric layer is between approximately 30 and approximately 50 nm, nanometers.

Example 29 may include the device of examples 25 or 26, or of any other example herein, wherein the first or the second trace is a copper trace.

Example 30 may include the device of examples 25 or 26, or of any other example herein, further comprising means for creating the one or more vias by a laser via drill and an etching solution.

Example 31 may include the device of examples 25 or 26, or of any other example herein, further comprising means for etching the aluminum oxide layer with phosphoric acid or potassium hydroxide solution.

Example 32 may include the device of examples 25 or 26, or of any other example herein, further comprising means for coupling a silicon nitride, SiNx, thin film layer to the second aluminum oxide layer, wherein the SiNx layer is an adhesion layer, electromigration barrier, or passivation layer.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A package comprising:
    a dielectric layer having a first side and a second side opposite the first side;
    a first trace applied to the first side of the dielectric layer;
    an aluminum oxide layer coupled with the first trace and an exposed area of the first side of the dielectric layer, wherein the first trace is substantially enclosed between the aluminum oxide layer and the first side of the dielectric layer, wherein the aluminum oxide layer is deposited using Plasma Enhanced Chemical Vapor Deposition, PECVD;
    a lamination layer coupled with the aluminum oxide layer on a side of the aluminum oxide layer opposite the dielectric layer, wherein the lamination layer includes epoxy and includes one or more vias to the first trace; and
    a conductive seed layer coupled with the lamination layer.

2. The package of claim 1, wherein the aluminum oxide layer is a first aluminum oxide layer, and further comprising:
    a second trace applied to the conductive seed layer, wherein subsequent to the second trace being applied, an exposed area of the conductive seed layer is removed to expose a portion of the lamination layer; and a second aluminum oxide layer coupled with the conductive seed layer and the second trace, wherein the second aluminum oxide layer is deposited using PECVD.

3. The package of claim 2, wherein a thickness of the aluminum oxide layer as measured in a direction perpendicular to the first side of the dielectric layer is between approximately 30 nanometers (nm) and approximately 50 nm.

4. The package of claim 2, wherein the first or the second trace is a copper trace.

5. The package of claim 2, wherein the one or more vias are created by a laser via drill and an etching solution.

6. The package of claim 2, wherein the aluminum oxide layer is etched via phosphoric acid or potassium hydroxide solution.

7. The package of claim 2, further comprising a silicon nitride, SiNx, thin film layer coupled with the second aluminum oxide layer, wherein the SiNx layer is an adhesion layer, electromigration barrier, or passivation layer.

* * * * *